(12) United States Patent
Kapoor et al.

(10) Patent No.: US 11,258,421 B2
(45) Date of Patent: Feb. 22, 2022

(54) COMBINER AND DISTRIBUTOR FOR ADJUSTING IMPEDANCES OR POWER ACROSS MULTIPLE PLASMA PROCESSING STATIONS

(71) Applicant: Lam Research Corporation, Fremont, CA (US)

(72) Inventors: Sunil Kapoor, Vancouver, WA (US); George Thomas, Fremont, CA (US); Yaswanth Rangineni, Beaverton, OR (US); Edward Augustyniak, Tualatin, OR (US)

(73) Assignee: Lam Research Corporation, Fremont, CA (US)

( * ) Notice: Subject to any disclaimer, the term of this patent is extended or adjusted under 35 U.S.C. 154(b) by 65 days.

(21) Appl. No.: 16/797,975

(22) Filed: Feb. 21, 2020

(65) Prior Publication Data
US 2020/0195216 A1    Jun. 18, 2020

Related U.S. Application Data

(63) Continuation of application No. 16/249,284, filed on Jan. 16, 2019, now Pat. No. 10,622,962, which is a continuation of application No. 15/254,769, filed on Sep. 1, 2016, now Pat. No. 10,187,032.

(60) Provisional application No. 62/351,879, filed on Jun. 17, 2016.

(51) Int. Cl.
*H03H 7/40* (2006.01)
*C23C 16/505* (2006.01)
*C23C 16/52* (2006.01)
*C23C 16/458* (2006.01)

(52) U.S. Cl.
CPC ............ *H03H 7/40* (2013.01); *C23C 16/458* (2013.01); *C23C 16/505* (2013.01); *C23C 16/52* (2013.01)

(58) Field of Classification Search
CPC ..... C23C 16/458; C23C 16/505; C23C 16/52; H03H 7/40; H01P 5/12
USPC ........................................ 333/17.1
See application file for complete search history.

(56) References Cited

U.S. PATENT DOCUMENTS 7,169,256 B2 * 1/2007 Dhindsa ............ H01J 37/32082
                                              118/723 E

* cited by examiner

*Primary Examiner* — Hafizur Rahman
(74) *Attorney, Agent, or Firm* — Penilla IP, APC

(57) ABSTRACT

Systems and methods for adjusting impedances or power or a combination thereof across multiple plasma processing stations are described. One of the systems includes a first radio frequency (RF) generator that generates a first RF signal having a first frequency, a second RF generator that generates a second RF signal having a second frequency, and a first matching network coupled to the first RF generator to receive the first RF signal. The first impedance matching network outputs a first modified RF signal upon receiving the first RF signal. The system further includes a second matching network coupled to the second RF generator to receive the second RF signal. The second matching network outputs a second modified RF signal upon receiving the second RF signal. The system further includes a combiner and distributor coupled to an output of the first matching network and an output of the second matching network.

22 Claims, 6 Drawing Sheets

FIG. 6 (Sensor control)

COMBINER AND DISTRIBUTOR FOR ADJUSTING IMPEDANCES OR POWER ACROSS MULTIPLE PLASMA PROCESSING STATIONS

CLAIM OF PRIORITY

The present patent application is a continuation of and claims the benefit of and priority, under 35 U.S.C. § 120, to U.S. patent application Ser. No. 16/249,284, filed on Jan. 16, 2019, and titled "COMBINER AND DISTRIBUTOR FOR ADJUSTING IMPEDANCES OR POWER ACROSS MULTIPLE PLASMA PROCESSING STATIONS", which is a continuation of and claims the benefit of and priority, under 35 U.S.C. § 120, to U.S. patent application Ser. No. 15/254,769, filed on Sep. 1, 2016, titled "COMBINER AND DISTRIBUTOR FOR ADJUSTING IMPEDANCES OR POWER ACROSS MULTIPLE PLASMA PROCESSING STATIONS", and issued as U.S. Pat. No. 10,187,032 on Jan. 22, 2019, which claims the benefit of and priority, under 35 U.S.C. § 119(e), to U.S. Provisional Patent Application No. 62/351,879, filed on Jun. 17, 2016, and titled "COMBINER AND DISTRIBUTOR FOR ADJUSTING IMPEDANCES ACROSS MULTIPLE PLASMA PROCESSING STATIONS", all of which are incorporated by reference herein in their entirety.

FIELD

The present embodiments relate to systems and methods for adjusting impedances or power or a combination thereof across multiple plasma processing stations.

BACKGROUND

Generally, process reactors are used to process operations upon wafers, e.g., silicon wafers. These wafers are typically processed numerous times in various reactors in order to form integrated circuits thereon. Some of these process operations involve, for instance, depositing materials over select surfaces or layers of a wafer. One such reactor is a plasma enhanced chemical vapor deposition (PECVD) reactor.

For example, a PECVD reactor may be used to deposit insulation films such as silicon oxide (SiO), silicon nitride (SiN), silicon carbide (SiC), silicon oxycarbide (SiOC), and others. Such material films may include an aluminum (Al) alloy. Depending on the type of film being deposited, specific reaction gases are brought into the PECVD reactor while radio frequency (RF) power is supplied to produce plasma that enables the deposition. The RF power is generated by an RF generator and provided via a matchbox to an electrode of the PECVD reactor.

It is in this context that embodiments described in the present disclosure arise.

SUMMARY

Embodiments of the disclosure provide systems and methods for adjusting impedances or power or a combination thereof across multiple plasma processing stations. It should be appreciated that the present embodiments can be implemented in numerous ways, e.g., a process, an apparatus, a system, a device, or a method on a computer-readable medium. Several embodiments are described below.

In various embodiments, systems and methods to split multiple non 50 ohm source signals to multiple substrate stations sharing a vacuum environment with selectivity to divert power to specific ones of the substrate stations and ignite, enable, or control plasma on specific one of the substrate stations are provided. This includes plasma processing of specific ones of the substrate stations pre-selected and radio frequency (RF) insitu balancing for station to station substrate process variability control using active tunable elements in a capacitive coupled plasma system environment.

In some embodiments, coaxial and non coaxial type outputs are provided to the substrate stations with various impedance range and various power levels.

In various embodiments, a combiner and distributor for multiple frequencies with adequate tuning range to accommodate a variety of impedance transformations in the substrate stations during a multi-step process is provided. The combiner and distributor receives multiple non 50 ohm power signals with various impedance ranges and various power levels as inputs from active tuning matching networks outputs. Moreover, switches, e.g., vacuum relay based switches, etc., in the combiner and distributor divert power to dummy impedances for the substrate stations not needing power. The combiner and distributor introduce signals of the multiple frequencies to each of the substrate stations. Also, the combiner and distributor varies the signals of the multiple frequencies to each of the substrate stations. The combiner and distributor includes filters, e.g., direct current (DC) blocking capacitors, inductors, etc., for isolation of the frequencies from each other and minimizing feedback to inputs of the combiner and distributor.

In some embodiments, the combiner and distributor includes a balancing inductor at each of its outputs to manage plasma sheath capacitance change with RF power and also controlling resonant frequency shift during plasma ignition and other process recipe transitions.

In various embodiments, an automated control, e.g., a probe control and system control, etc., is provided to vary positions of tuning elements, e.g., capacitors, etc., of the combiner and distributor for each of the substrate stations during active RF processes to provide impedance transformation.

In some embodiments, a method to move and control variable capacitors, e.g., vacuum capacitors, etc., during a plasma process to enable running multi layer process with varying impedance transformations is provided. The automated control of active change in the tuning elements helps active compensation by controlling RF signal amplitude and phase.

In various embodiments, the combiner and distributor is remotely mounted and outputs of the combiner and distributor are coaxed to electrode inputs of the substrate stations.

In several embodiments, a parameter probe, e.g., a complex voltage and current probe, etc., is connected to each of the substrate stations to monitor and provide feedback to the probe control and system control. The probe control and system control uses a mechanism to run closed loop system for power control.

In some embodiments, the combiner and distributor allows to process multi-layer processes without turning off RF power.

In various embodiments, the combiner and distributor allows active change of RF signal levels to each of the substrate stations to improve station to station matching or desired process results in each of the substrate stations.

In several embodiments, the automated control of change in the tuning elements helps active compensation by controlling RF signal amplitude and phase.

In some embodiments, a system for adjusting impedances or power or a combination thereof across multiple plasma processing stations is described. The system includes a first RF generator that generates a first RF signal having a first frequency, a second RF generator that generates a second RF signal having a second frequency, and a first matching network coupled to the first RF generator to receive the first RF signal. The first impedance matching network outputs a first modified RF signal upon receiving the first RF signal. The system further includes a second matching network coupled to the second RF generator to receive the second RF signal. The second matching network outputs a second modified RF signal upon receiving the second RF signal. The system further includes a combiner and distributor coupled to an output of the first matching network and an output of the second matching network. The combiner and distributor combines the first modified RF signal and the second modified RF signal to provide combined RF signals to the plasma processing stations. The combiner and distributor has multiple outputs coupled to the plasma processing stations. The combiner and distributor includes a plurality of tuning circuits for the first and second frequencies to tune impedances associated with the plasma processing stations based on a parameter measured at the outputs of the combiner and distributor.

In several embodiments, the combiner and distributor is described. The combiner and distributor includes a first frequency circuit coupled to the first RF generator via the first matching network to receive the first modified RF signal of the first frequency from the first matching network. The first frequency circuit outputs a plurality of RF signals upon receiving the first modified RF signal. The combiner and distributor further includes a second frequency circuit coupled to the second RF generator via the second matching network to receive the second modified RF signal of the second frequency from the second matching network. The second frequency circuit outputs a plurality of RF signals upon receiving the second modified RF signal. The second frequency circuit is coupled to the first frequency circuit. The combiner and distributor includes an output circuit coupled to the second frequency circuit. The output circuit combines each of the RF signals output from the first frequency circuit with a corresponding one of the RF signals output from the second frequency circuit to provide a plurality of combined RF signals to the plasma processing stations. The output circuit has multiple outputs coupled to the plasma processing stations. The first frequency circuit includes a plurality of first frequency tuning circuits for the first frequency to tune impedances or power associated with the plasma processing stations based on the parameter measured at the outputs of the output circuit. The second frequency circuit includes a plurality of second frequency tuning circuits for the second frequency to tune the impedances or power associated with the plasma processing stations based on the parameter measured at the outputs of the output circuit.

In some embodiments, a system for adjusting the impedance across the plasma processing stations is provided. The system includes a combiner and distributor. The combiner and distributor includes the first frequency circuit coupled to the first RF generator via the first matching network to receive the first modified RF signal of the first frequency from the first matching network. The first frequency circuit outputs a plurality of RF signals upon receiving the first modified RF signal. The combiner and distributor further includes the second frequency circuit coupled to the second RF generator via the second matching network to receive the second modified RF signal of the second frequency from the second matching network. The second frequency circuit outputs a plurality of RF signals upon receiving the second modified RF signal. The second frequency circuit is coupled to the first frequency circuit. The combiner and distributor includes the output circuit coupled to the second frequency circuit. The output circuit combines each of the RF signals output from the first frequency circuit with a corresponding one of the RF signals output from the second frequency circuit to provide a plurality of combined RF signals to the plasma processing stations. The output circuit has multiple outputs coupled to the plasma processing stations. The first frequency circuit includes the plurality of first frequency tuning circuits for the first frequency and the second frequency circuit includes the plurality of second frequency tuning circuits for the second frequency. The system further includes a system controller, e.g., the probe control and system control, etc., coupled to the combiner and distributor. The system controller tunes the first frequency tuning circuits based on a parameter measured at the outputs of the combiner and distributor. The system controller tunes the second frequency tuning circuits based on the parameter measured at the outputs of the output circuit.

Several advantages of the combiner and distributor include turning off plasma processing to one or more of the substrate stations without a need to turn off RF generators that generate RF signals of the multiple frequencies for providing power from the RF signals to the substrate stations. The turning off of the plasma processing is achieved by coupling the RF signals of the multiple frequencies to one or more dummy loads that correspond to one or more of the substrate stations.

Other advantages of the combiner and distributor include controlling the tuning elements to control values of the parameter at the outputs of the combiner and distributor to perform a variety of plasma processes. The tuning elements are controlled based on feedback received from the outputs of the combiner and distributor.

Yet other advantages of the combiner and distributor include blocking DC power, e.g., power associated with wafer DC bias, etc., that is generated by plasma within a plasma chamber.

Further advantages of the combiner and distributor include that in some embodiments, an RF source per frequency drives the plasma processing stations. Moreover, in various embodiments, all the plasma processing stations are driven in phase. Furthermore, in several embodiments, the combiner and distributor allows the plasma processing stations within a vacuum chamber to operate without a risk of frequency beats. Moreover, in some embodiments, high frequency power and low frequency power is turned off or on to the plasma processing stations at the same time to achieving synchronization for turn off or turn on. For example, there is simultaneous ignition of all the plasma processing stations due to current balancing that forces more current to non-ignited stations and thus forces ignition.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 6 is a diagram of an embodiment of a system to illustrate control of tuning elements of the combiner and distributor by a probe control and system control.

DETAILED DESCRIPTION

The following embodiments describe systems and methods for adjusting impedances or power or a combination thereof across multiple plasma processing stations. It will be apparent that the present embodiments may be practiced without some or all of these specific details. In other instances, well known process operations have not been described in detail in order not to unnecessarily obscure the present embodiments.

Deposition of films is preferably implemented in a plasma enhanced chemical vapor deposition (PECVD) system. The PECVD system may take many different forms. The PECVD system includes one or more plasma chambers or "reactors" (sometimes including multiple stations) that house one or more wafers and are suitable for wafer processing. Each plasma chamber houses one or more wafers for processing. The one or more plasma chambers maintain a wafer in a defined position or positions with or without motion within that position, e.g. rotation, vibration, or other agitation, etc. The wafer undergoing deposition is transferred from one station to another within a chamber during a process. The film deposition occurs entirely at a single station or any fraction of the film is deposited at any number of stations. While in process, each wafer is held in place by a pedestal, e.g., a wafer chuck, etc., and/or other wafer holding apparatus of the plasma chamber.

Figure 1:
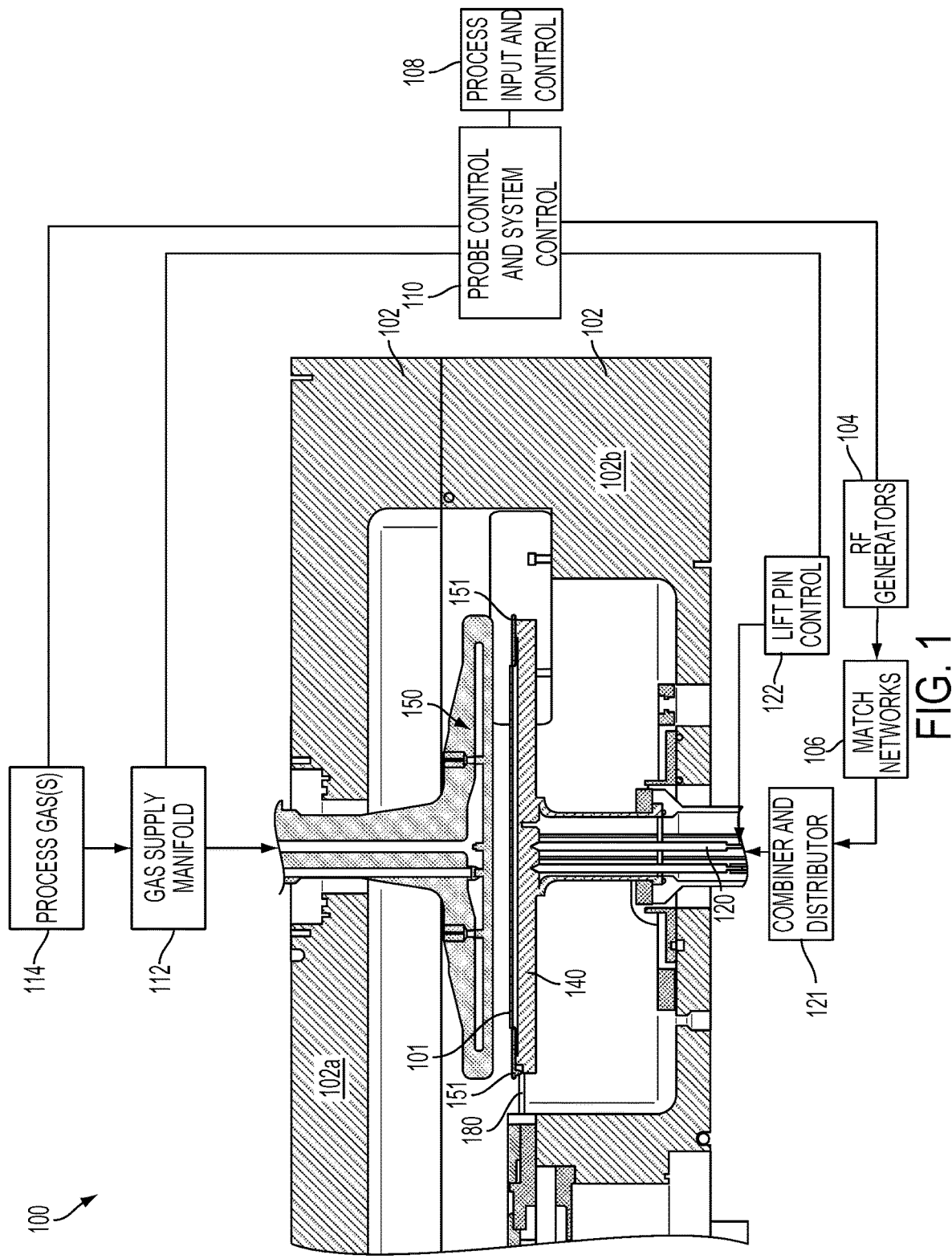
FIG. 1 illustrates a substrate processing system that is used to process a wafer.

FIG. 1 illustrates a substrate processing system 100, which is an example of the PECVD system used to process a wafer 101. The substrate processing system 100 includes a plasma chamber 102 having a lower chamber portion 102b and an upper chamber portion 102a. A center column is configured to support a pedestal 140, which in one embodiment includes a powered lower electrode. The pedestal 140 is electrically coupled to a combiner and distributor 121, which is further coupled to multiple match networks 106. The match networks 106 are coupled to multiple radio frequency (RF) generators 104. The RF generators 104 are controlled by a probe control and system control 110, e.g., a controller, etc. Examples of a controller include a processor and a memory device. The processor, for example, is an application specific integrated circuit (ASIC), a programmable logic device (PLD), a central processing unit (CPU), or a microprocessor, etc. Examples of the memory device include a read-only memory (ROM), a random access memory (RAM), a redundant array of storage disks, a hard disk, a Flash memory, etc. The probe control and system control 110 operates the substrate processing system 100 by executing a process input and control 108. The process input and control 108 includes process recipes, such as power levels, timing parameters, process gasses, mechanical movement of the wafer 101, etc., so as to deposit or form films over the wafer 101.

The center column is also shown to include lift pins 120, which are controlled by a lift pin control 122. The lift pins 120 are used to raise the wafer 101 from the pedestal 140 to allow an end-effector to pick the wafer 101 and to lower the wafer 101 after being placed by the end-effector. The substrate processing system 100 further includes a gas supply manifold 112 that is connected to process gases 114, e.g., gas chemistry supplies from a facility, etc. Depending on the processing being performed, the probe control and system control 110 controls a delivery of the process gases 114 via the gas supply manifold 112. The chosen gases are then flown into a shower head 150 and distributed in a space volume, e.g., a gap, etc., defined between the showerhead 150 face that faces that wafer 101 and the pedestal 140.

Further, in some embodiments, the process gases 114 are premixed or not. Appropriate valving and mass flow control mechanisms is employed to ensure that the correct process gases are delivered during deposition and plasma treatment phases of the process. The process gases 114 exit the plasma chamber 102 via an outlet. A vacuum pump, e.g., a one or two stage mechanical dry pump, a turbomolecular pump, etc., draws process gases out and maintains a suitably low pressure within the plasma chamber 102 by a close loop controlled flow restriction device, such as a throttle valve or a pendulum valve.

Also shown is a carrier ring 151 that encircles an outer region of the pedestal 140. The carrier ring 151 sits over a carrier ring support region that is a step down from a wafer support region in the center of the pedestal 140. The carrier ring 151 includes an outer edge side of its disk structure, e.g., outer radius, etc., and a wafer edge side of its disk structure, e.g., inner radius, etc., that is closest to where the wafer 101 sits. The wafer edge side of the carrier ring 151 includes a plurality of contact support structures which lift the wafer 101 when the carrier ring 151 is lifted by multiple spider forks 180. The carrier ring 151 is therefore lifted along with the wafer 101 and is rotated to another station, e.g., in a multi-station system.

In an embodiment, an upper electrode within the showerhead 150 is grounded when RF power is supplied from the RF generators 104 to the lower electrode within the pedestal 140.

In one embodiment, instead of the pedestal 140 being electrically coupled to the RF generators 104 via the match networks 106, the upper electrode within the showerhead 150 is coupled to the RF generators 104 via multiple match networks for receiving power from the RF generators 104 and the lower electrode within the pedestal 140 is grounded.

In some embodiments, the RF generators 104 generate RF signals having different frequencies, e.g., one of the RF generators 104 generates an RF signal having a low frequency and another one of the RF generators 104 generates an RF signal having a high frequency, which is higher than the low frequency.

Figure 2:
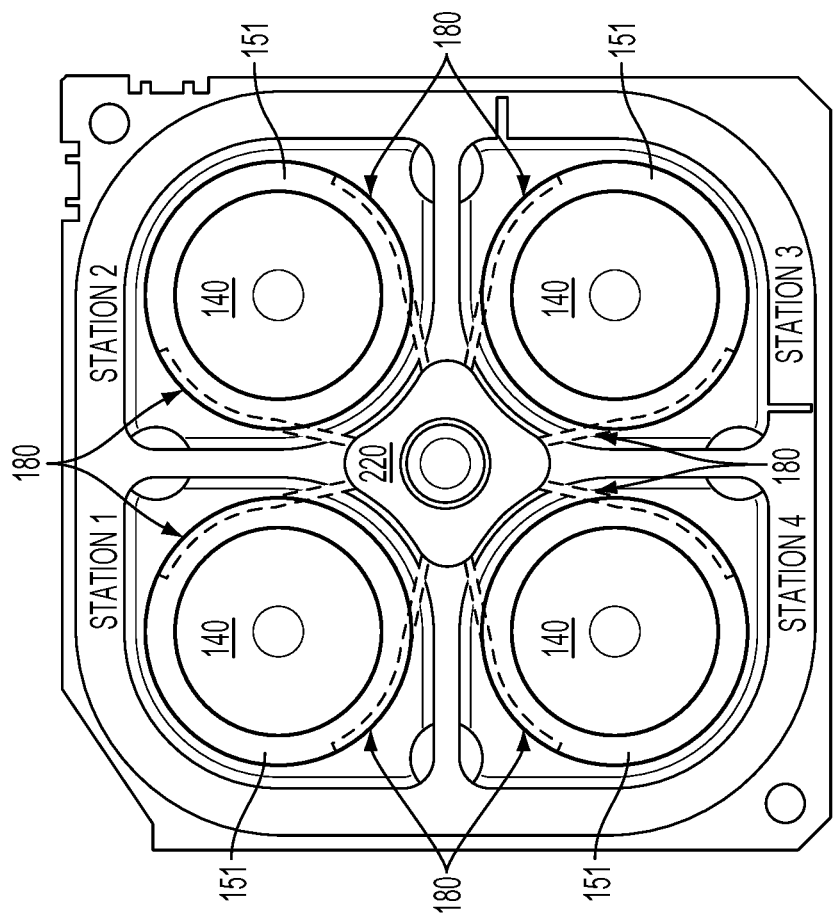
FIG. 2 illustrates a top view of a multi-station processing tool, where four processing stations are provided.

FIG. 2 illustrates a top view of a multi-station processing tool, where four processing stations, which are station 1, station 2, station 3, and station 4, are provided. The four stations are accessed by the spider forks 180. In one embodiment, there is no isolation wall or other mechanism to isolate one station from another. Each spider fork 180 includes a first and second arm, each of which is positioned around a portion of each side of the pedestal 140. In this view, the spider forks 180 are drawn in dash-lines, to convey that they are below the carrier ring 151. The spider forks 180, using an engagement and rotation mechanism 220, raise up and lift the carrier rings 151 from a lower surface of the carrier rings 151 from the stations 1 through 4 simultaneously, and then rotate between two or more stations 1 through 4 before lowering the carrier rings 151. During the rotation, at least one of the carrier rings 151 supports the wafer 101 to a next location so that further plasma processing, treatment and/or film deposition takes place on the wafer 101.

Figure 3:
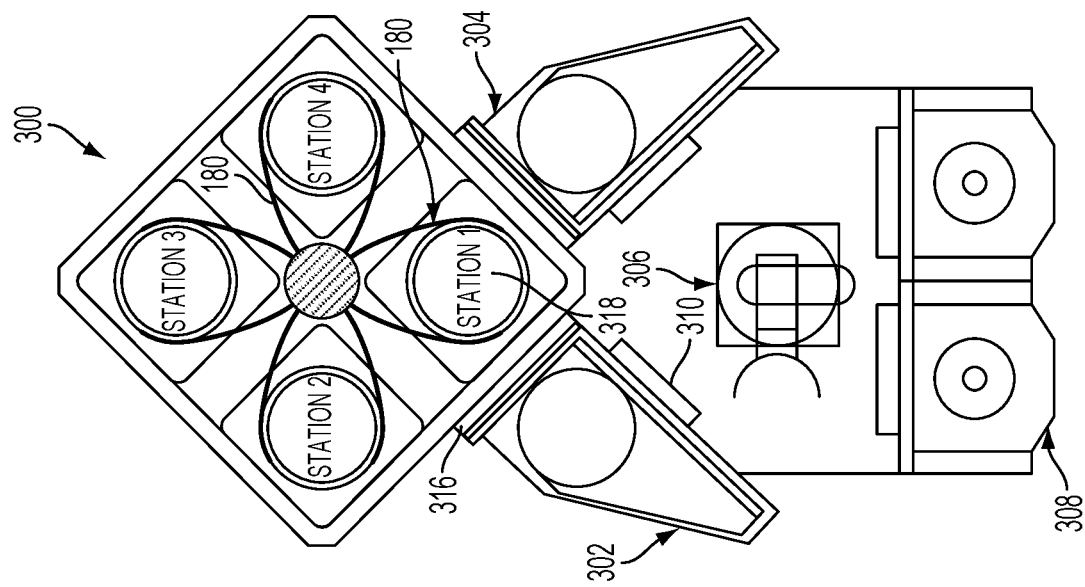
FIG. 3 shows a schematic view of an embodiment of a multi-station processing tool with an inbound load lock and an outbound load lock.

FIG. 3 shows a schematic view of an embodiment of a multi-station processing tool 300 with an inbound load lock 302 and an outbound load lock 304. A robot 306, at atmospheric pressure, moves substrates, e.g., the wafer 101, etc., from a cassette loaded through a pod 308 into the inbound load lock 302 via an atmospheric port 310. The inbound load lock 302 is coupled to a vacuum source (not shown) so that, when atmospheric port 310 is closed, the inbound load lock 302 is pumped down. The inbound load lock 302 also includes a chamber transport port 316 interfaced with one of the stations 1 through 4. Thus, when the chamber transport port 316 is open, another robot (not shown) moves the wafer 101 from the inbound load lock 302 to the pedestal 140 of the station 1 for processing.

In some embodiments, a low pressure environment is maintained in an enclosure that encloses the stations 1 through 4 so that substrates are transferred using the carrier ring 151 among the stations 1 through 4 without experiencing a vacuum break and/or air exposure. Each of the stations 1 through 4 includes a process station substrate holder and process gas delivery line inlets.

The spider forks 180 transfer substrates among the stations 1 through 4. The spider forks 180 rotate and enable transfer of the wafer 101 from one of the stations 1 through 4 to another one of the stations 1 through 4. The transfer occurs by enabling the spider forks 180 to lift the carrier rings 151 from an outer undersurface, which lifts the wafer 101, and rotates the wafer 101 and the carrier ring 151 together to the next station. In one configuration, the spider forks 180 are made from a ceramic material to withstand high levels of heat during processing.

In various embodiments, a number of stations other than four is used. For example, three or two or five plasma processing stations are used to process the wafer 101.

Figure 4:
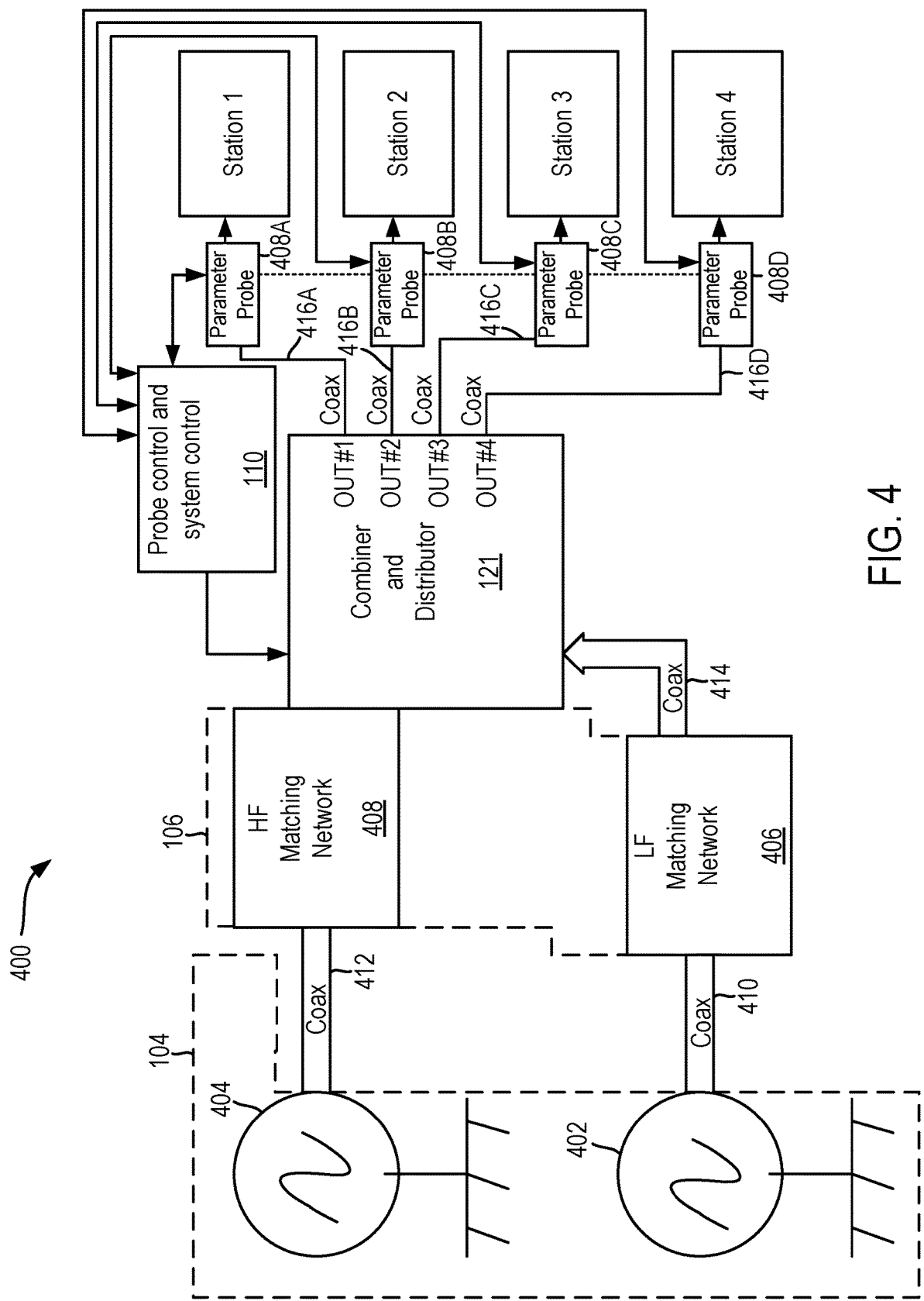
FIG. 4 is a diagram of an embodiment of a system for illustrating use of a combiner and distributor in combining and distributing radio frequency (RF) power to the stations.

FIG. 4 is a diagram of an embodiment of a system 400 for illustrating use of the combiner and distributor 121 in combining and distributing RF power to the stations 1 through 4. The system 400 includes a low frequency generator 402 and a high frequency generator 404. An example of the high frequency generator 404 includes an RF generator having an operating frequency of 13 megahertz (MHz) or 27 MHz or 60 MHz. An example of the low frequency generator 402 includes a generator having an operating frequency of 2 MHz or 400 kilohertz (kHz).

The system 400 further includes a low frequency matching network 406 and a high frequency matching network 408. An input of the low frequency matching network 406 is coupled to an output of the low frequency generator 402 via a coaxial cable 410 and an input of the high frequency matching network 408 is coupled to an output of the high frequency generator 404 via another coaxial cable 412. A matching network includes a circuit having one or more capacitors, one or more inductors, and/or one or more resistors.

An output of the low frequency matching network 406 is coupled via a coaxial cable 414 to the combiner and distributor 121 and an output of the high frequency matching network 408 is coupled to the combiner and distributor 121. For example, there is no coaxial cable coupling the output of the high frequency matching network 408 to the input of the combiner and distributor 121. In some embodiment, the coaxial cable couples the output of the high frequency matching network 408 to the input of the combiner and distributor 121.

A first output OUT #1 of the combiner and distributor 121 is coupled via a coaxial cable 416A to the station 1, e.g., the showerhead 150 of the station 1 or the pedestal 140 of the station 1, etc. Moreover, a second output OUT #2 of the combiner and distributor 121 is coupled via a coaxial cable 416B to the station 2, e.g., the showerhead 150 of the station 2 or the pedestal 140 of the station 2, etc. A third output OUT #3 of the combiner and distributor 121 is coupled via a coaxial cable 416C to the station 3, e.g., the showerhead 150 of the station 3 or the pedestal 140 of the station 3, etc. Moreover, a fourth output OUT #4 of the combiner and distributor 121 is coupled via a coaxial cable 416D to the station 4, e.g., the showerhead 150 of the station 4 or the pedestal 140 of the station 4, etc.

A parameter probe 408A is coupled to the OUT #1, a parameter probe 408B is coupled to the OUT #2, a parameter probe 408C is coupled to the OUT #3, and a parameter probe 408D is coupled to the OUT #4. The parameter probes 408A through 408D are coupled to the probe control and system control 110, which is further coupled to the combiner and distributor 121. Examples of a parameter probe include a complex voltage and current sensor, a complex voltage sensor, a complex current sensor, an impedance sensor, a direct current (DC) bias voltage sensor, a complex power probe, etc.

The low frequency generator 402 generates an RF signal having a frequency, e.g., 2 MHz frequency, 400 kHz frequency, etc., and provides the RF signal via the coax cable 410 to the input of the low frequency matching network 406. The low frequency matching network 406 matches an impedance of a load, e.g., the coaxial cable 414, the combiner and distributor 121, the coaxial cables 416A through 416D, and the stations 1 through 4, etc., that is coupled to the output of the low frequency matching network 406 with that of a source, e.g., the coaxial cable 410 and the low frequency generator 402, etc., that is coupled to the input of the low frequency matching network 406 to generate a modified RF signal upon receiving the RF signal from the low frequency RF generator 402.

Similarly, the high frequency generator 404 generates an RF signal having a frequency, e.g., 13 MHz frequency, 27 MHz frequency, 60 MHz frequency, etc., and provides the RF signal via the coax cable 412 to the input of the high frequency matching network 408. The high frequency matching network 408 matches an impedance of a load, e.g., the combiner and distributor 121, the coaxial cables 416A through 416D, and the stations 1 through 4, etc., that is coupled to the output of the high frequency matching network 408 with that of a source, e.g., the coaxial cable 412 and the high frequency generator 404, etc., that is coupled to the input of the high frequency matching network 408 to generate a modified RF signal upon receiving the RF signal from the high frequency RF generator 404.

The combiner and distributor 121 receives the modified RF signals from the low frequency matching network 406 and the high frequency matching network 408, and combines the RF signals to generate combined RF signals. One of the combined RF signals is sent via the OUT #1 to the station 1, another one of the combined RF signals is sent via the OUT #2 to the station 2, yet another one of the combined RF signals is sent via the OUT #3 to the station 3, and another one of the combined RF signals is sent via the OUT #4 to the station 4.

The parameter probe 408A measures a value of a parameter, e.g., complex voltage and current, DC bias voltage, complex impedance, complex power, etc., at the OUT #1 and provides the value to the probe control and system control 110. Moreover, the parameter probe 408B measures a value of the parameter at the OUT #2 and provides the value to the probe control and system control 110. The parameter probe 408C measures a value of the parameter at the OUT #3 and provides the value to the probe control and system control 110. The parameter probe 408D measures a value of the parameter at the OUT #4 and provides the value to the probe control and system control 110.

The processor of the probe control and system control 110 determines one or more values of a variable, e.g., capacitance, etc., of corresponding one or more tuning circuits of the combiner and distributor 121 based on the values of the parameter received from the parameter probes 408A through 408D. For example, the processor of the probe control and system control 110 determines that for a value of the parameter associated with the station 1 to be within a pre-determined range, e.g., same as, etc., from a value of the parameter associated with the station 2, a value of the variable of one of the tuning circuits of the combiner and distributor 121 is V1 and a value of the variable of another one of the tuning circuits of the combiner and distributor 121 is V2. The processor of the probe control and system control 110 controls the tuning circuits of the combiner and distributor 121 to achieve the values V1 and V2 of the variable to achieve the pre-determined range between the values of the parameter. As another example, a correspondence, e.g., a one-to-one matching, an association, a mapping, a row within a look-up table, etc., among values of the variable of all tuning circuits of the combiner and distributor 121 and values of the parameter at the outputs OUT #1 through OUT #4 is stored within the memory device that is coupled to the processor. Upon receiving a value of the parameter from the parameter probe 408A and a value of the parameter from the parameter probe 408B, the processor determines that the values are not within the pre-determined range from each other. The processor accesses the correspondence from the memory device to determine a value of the variable of one of the tuning circuits coupled to the OUT #1 so that the value of the parameter at the OUT #1 is within the pre-determined range from a value of the parameter of another one of the tuning circuits coupled to the OUT #2. The processor controls the value of the variable of the tuning circuit coupled to the OUT #1 and/or the value of the variable of the tuning circuit coupled to the OUT #2 so that the value of the parameter at the OUT #1 is within the pre-determined range from the value of the parameter at the OUT #2.

It should be noted that a number of the outputs of the combiner and distributor 121 match a number of the stations. For example, in case three stations are used to process the wafer 101, the combiner and distributor 121 has three outputs, where each output is coupled to a corresponding one of the stations.

In some embodiments, instead of the low frequency generator 402, a medium frequency generator is used. An example of the medium frequency generator includes an RF generator having an operating frequency of 1 MHz or 2 MHz. In these embodiments, the medium frequency generator generates an RF signal having the medium frequency. Moreover, instead of the low frequency matching network 406, a medium frequency matching network is used.

In various embodiments, a tool controller is coupled to the probe control and system control 110 to provide instructions to the probe control and system control 110 to perform the functions described herein, e.g., power distribution function, etc., as being performed by the probe control and system control 110.

In some embodiments, the probe control and system control 110 includes any number of controllers for performing the functions described herein as being performed by the probe control and system control 110 and the functions are distributed between the controllers. For example, the tool controller is a part of the probe control and system control 110.

In various embodiments, the combiner and distributor 121, the high frequency matching network 408, and the low frequency matching network 406 are remotely located from the stations 1 through 4. For example, a length of the each of the coax cables 416A through 416D ranges from four feet to six feet. As another example, a length of the each of the coax cables 416A through 416D ranges from six feet to eight feet.

In some embodiments, each of the coax cables 416A through 416D is a part of the combiner and distributor 121. For example, each of the coax cables 416A through 416D is not a 50 ohm RF transmission line. To illustrate, each of the coax cables 416A through 416D does not encounter an impedance of 50 ohms at its input and output. Rather, RF power being transferred via each of the coax cables 416A through 416D undergoes a change in voltage and current along a length of the coax cable. To illustrate, each of the coax cables 416A through 416D offers a series of capacitances and a series of inductances to an RF signal received from the corresponding outputs OUT #1, OUT #2, OUT #3, and OUT #4 and passing through the coax cable.

Figure 5:
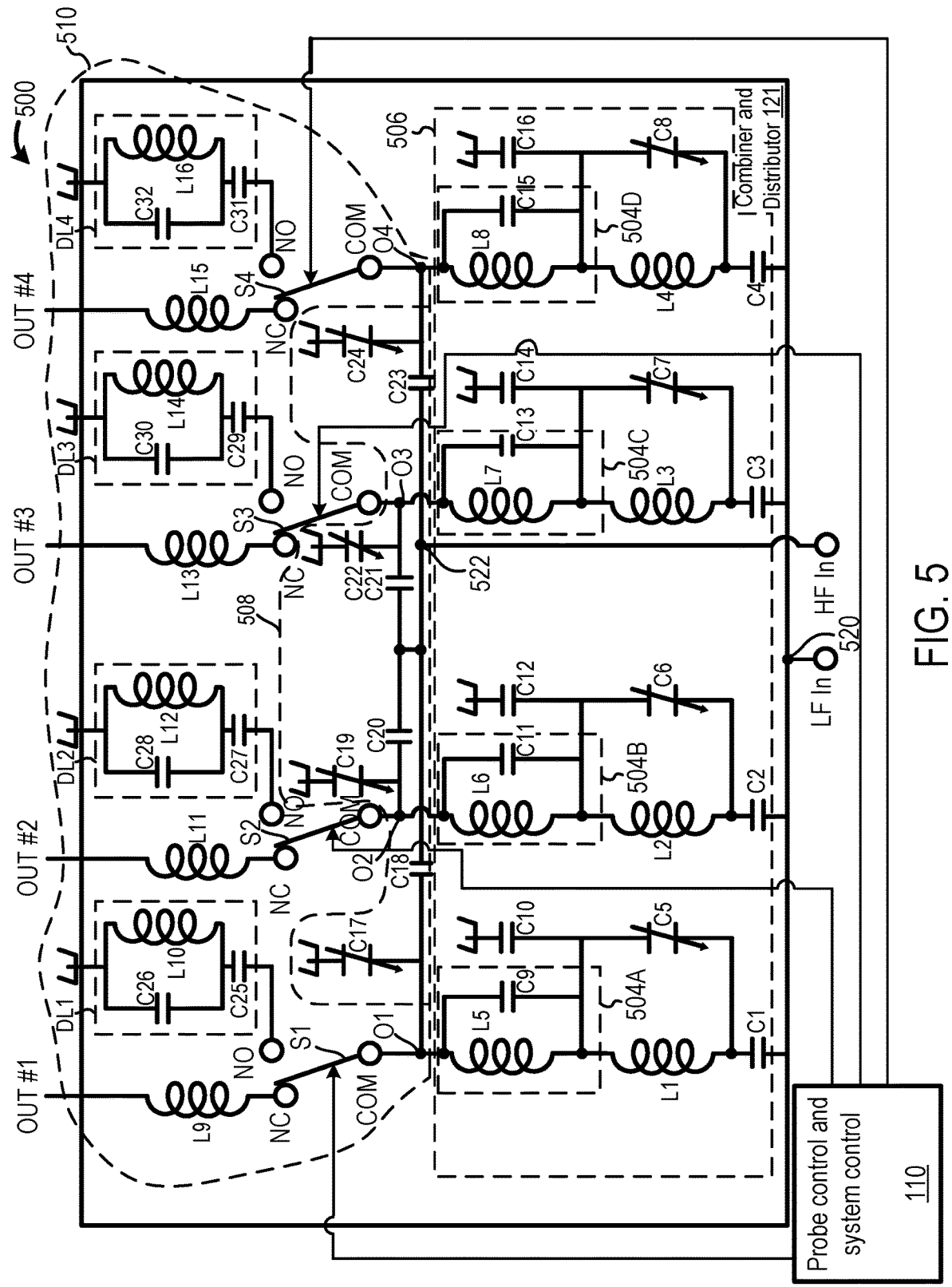
FIG. 5 is an embodiment of a system to illustrate a circuit diagram of an embodiment of the combiner and distributor.

FIG. 5 is an embodiment of a system 500 to illustrate a circuit diagram of an embodiment of the combiner and distributor 121. The system 500 includes the probe control and system control 110 and further includes the combiner and distributor 121.

The combiner and distributor 121 has a low frequency circuit 506, a high frequency circuit 508, and an output circuit 510. The low frequency circuit 506 is coupled to the high frequency circuit 508, which is further coupled to the output circuit 510. The low frequency circuit 506 includes DC blocking capacitors C1, C2, C3, and C4. The low frequency circuit 506 further includes multiple tuning circuits C5, C6, C7, and C8, which are variable capacitors, and the low frequency circuit 506 further includes inductors L1, L2, L3, and L4. The low frequency circuit 506 includes a high frequency blocking circuit 504A, a high frequency blocking circuit 504B, and a high frequency blocking circuit 504C, a high frequency blocking circuit 504D. The high frequency blocking circuit 504A includes an inductor L5 coupled in parallel with a capacitor C9. Similarly, the high frequency blocking circuit 504B includes an inductor L6 coupled in parallel with a capacitor C11, the high frequency blocking circuit 504C includes an inductor L7 coupled in parallel with a capacitor C14, and the high frequency blocking circuit 504D includes an inductor L8 coupled in parallel with a capacitor C15. The low frequency circuit 506 further includes capacitors C10, C12, C14, and C16.

The high frequency circuit 508 has capacitors C18, C20, C21, and C23. The high frequency circuit 508 further includes tuning circuits C17, C19, C22, and C24, which are variable capacitors. In some embodiments, each of the variable capacitors C5, C6, C7, C8, C17, C19, C22, and C24 is a vacuum capacitor.

The output circuit 510 includes dummy loads DL1, DL2, DL3, and DL4, and further includes balancing inductors L9, L11, L13, and L15. The output circuit 510 includes switches S1, S2, S3, and S4. An example of a switch includes a transistor or a combination of one or more transistors.

The dummy load DL1 includes a capacitor C26 coupled in parallel to an inductor L10, and further includes a DC blocking capacitor C25. Similarly, the dummy load DL2 includes a capacitor C28 coupled in parallel to an inductor L12, and further includes a DC blocking capacitor C27. Also, the dummy load DL3 includes a capacitor C30 coupled in parallel to an inductor L14, and further includes a DC blocking capacitor C29. The dummy load DL4 includes a capacitor C32 coupled in parallel to an inductor L16, and further includes a DC blocking capacitor C31. Each of the DC blocking capacitors C25, C27, C29, and C30 blocks DC power from reaching the corresponding capacitors C26, C28, C29, and C32, and the corresponding inductors L10, L12, L14, and L16 of the dummy loads DL1 through DL4. To illustrate, the DC blocking capacitor C25 blocks the DC power from being transferred from the plasma of the station 1 via the OUT #1 to the capacitor C26 and the inductor L10. The DC power is received from the plasma generated within the corresponding stations 1 through 4. For example, the DC power blocked by the DC block capacitor C25 is generated by wafer DC bias created by plasma in one of the stations 1 through 4.

The capacitors C1 through C4 are coupled via an input 520 of the low frequency circuit 506 to the low frequency matching network 406 (FIG. 4) to receive the modified RF signal of the low frequency from the low frequency matching network 406 via the coaxial cable 414 (FIG. 4) and the input 520. The capacitors C1 through C4 block the DC power received from plasma generated within the stations 1 through 4 from reaching the low frequency RF generator 402 (FIG. 4) via the input 520, the coaxial cable 414, the low frequency matching network 406, and the coaxial cable 410 (FIG. 4).

Each of the inductors L1 through L4 acts as a capacitor at the high frequency. The high frequency blocking circuits 504A through 504D blocks the high frequency of the modified RF signal of the high frequency received from the high frequency matching network 408 (FIG. 4) via an input 522 of the output circuit 510 from reaching the low frequency RF generator 402 via the input 520, the coaxial cable 414, the low frequency matching network 406, and the coaxial cable 410.

The capacitors C10, C12, C14, and C16 provide a path to ground for any residual high frequency power leaked from the corresponding high frequency blocking circuits 504A through 504D. One or more capacitances of corresponding one or more of the variable capacitors C5 through C8 are changed so that the values of the parameter at two or more of the outputs OUT #1, OUT #2, OUT #3, and OUT #4 are within the pre-determined range from each other. Similarly, one or more capacitances of corresponding one or more of the variable capacitors C17, C19, C22, and C24 are changed so that the values of the parameter at two or more of the outputs OUT #1, OUT #2, OUT #3, and OUT #4 are within the pre-determined range from each other. In some embodiments, one or more of the capacitances of corresponding one or more of the variable capacitors C5, C6, C7, C8, C17, C19, C22, and C24 are changed so that the values of the parameter at two or more of the outputs OUT #1, OUT #2, OUT #3, and OUT #4 are within the pre-determined range from each other. The capacitors C18, C20, C21, and C23 filter out the low frequency of the modified RF signal received from the low frequency matching network 406 via the coaxial cable 414 and the input 520.

Each of the switches S1 through S4 is open, e.g., normally open (NO), etc., by being coupled to a normally open terminal of the switch or closed, e.g., normally closed (NC), etc., by being coupled to a normally closed terminal of the switch. Each of the switches switches S1 through S4 is open or closed with respect to a common terminal (COM) of the switch. For example, when an off signal, e.g. an amount of current less than a pre-specified amount, etc., is sent from the processor to the switch S1, the switch S1 is in the open position, e.g., an off state, etc. Moreover, when an on signal, e.g. an amount of current greater than the pre-specified amount, etc., is sent from the processor to the switch S1, the switch is in the closed position, e.g., an on state, etc.

The switches S1 through S4 are coupled to the probe control and system control 110 to be controlled by the probe control and system control 110. The switches S1 through S4 are controlled to be in the open or close position upon receiving a control signal from the processor of the probe control and system control 110. For example, the switch S1 closes to couple an output O1 of the low frequency circuit 506 and the high frequency circuit 508 to the station 1 via the OUT #1 of the output circuit 510 so that plasma is enabled, e.g., generated, maintained, etc., within the station 1. As another example, the switch S2 closes to couple an output O2 of the low frequency circuit 506 and the high frequency circuit 508 to the station 2 via the OUT #2 of the output circuit 510 so that plasma is enabled within the station 2. As yet another example, the switch S3 closes to couple an output O3 of the low frequency circuit 506 and the high frequency circuit 508 to the station 3 via the OUT #3 of the output circuit 510 so that plasma is enabled within the station 3. As another example, the switch S4 closes to couple an output O4 of the low frequency circuit 506 and the high frequency circuit 508 to the station 4 via the OUT #4 of the output circuit 510 so that plasma is enabled within the station 4. As another example, the switch S1 is open to couple the output O1 of the low frequency circuit 506 and the high frequency circuit 508 to the dummy load DL1 so that plasma is disabled. e.g., not generated, turned off, etc., within the station 1. As another example, the switch S2 is open to couple the output O2 of the low frequency circuit 506 and the high frequency circuit 508 to the dummy load DL2 so that plasma is disabled within the station 2. As yet another example, the switch S3 is open to couple the output O3 of the low frequency circuit 506 and the high frequency circuit 508 to the dummy load DL3 so that plasma is disabled within the station 3. As another example, the switch S4 is open to couple the output O4 of the low frequency circuit 506 and the high frequency circuit 508 to the dummy load DL4 so that plasma is disabled within the station 4.

By switching RF power to one or more of the stations 1 through 4, power is selectively diverted to the one or more stations 1 through 4 to enable plasma in the one or more of the stations 1 through 4. For example, the switch S1 is controlled by the probe control and system control 110 to be in the closed position so that RF power of the combined RF signal at the output O1 is sent to the station 1 via the inductor L9, the OUT #1, and the coaxial cable 416A (FIG. 4) to enable plasma within the station 1. As another example, the switch S2 is controlled by the probe control and system control 110 to be in the closed position so that RF power of the combined RF signal at the output O2 is sent to the station 2 via the inductor L11, the OUT #2, and the coaxial cable 416B (FIG. 4) to enable plasma within the station 2. As yet another example, the switch S3 is controlled by the probe control and system control 110 to be in the closed position so that RF power of the combined RF signal at the output O3 is sent to the station 3 via the inductor L13, the OUT #3, and the coaxial cable 416C (FIG. 4) to enable plasma within the station 3. As another example, the switch S4 is controlled by the probe control and system control 110 to be in the closed position so that RF power of the combined RF signal at the output O4 is sent to the station 4 via the inductor L15, the OUT #4, and the coaxial cable 416D (FIG. 4) to enable plasma within the station 4.

On one hand, when the station 1 is to be used for plasma processing, e.g., ignite, enable, or control plasma, etc., RF power to the station 1 is diverted from the dummy load DL1 to the station 1. For example, when the station 1 is to be used for processing the wafer 101, the switch S1 is controlled by the probe control and system control 110 to close the switch S1 so that RF power of the combined RF signal at the output O1 is diverted to the station 1 via the inductor L9 and the OUT #1. On the other hand, when one of the stations 1 through 4 is not to be used for plasma processing, RF power to the station is diverted to a dummy load corresponding to the station. For example, when the station 1 is not to be used for processing the wafer 101, the switch S1 is controlled by the probe control and system control 110 to open the switch S1 so that RF power of the combined RF signal at the output O1 is diverted to the dummy load DL1. There is no need to turn off, e.g., power off, remove power from, etc., one or both of the low frequency RF generator 402 and the high frequency RF generator 404 to remove RF power to the station 1.

In various embodiments, the outputs O1 through O4 are parts of the output circuit 510.

In some embodiments, the dummy load DL1 has an impedance that is within a pre-determined limit, e.g., same as, etc., from an impedance of the station 1, the dummy load DL2 has an impedance that is within the pre-determined limit from an impedance of the station 2, the dummy load DL3 has an impedance that is within the pre-determined limit from an impedance of the station 3, and the dummy load DL4 has an impedance that is within the pre-determined limit from an impedance of the station 4.

The modified RF signal that is received at the input 520 from the low frequency matching network 406 (FIG. 4) is processed by the inductors L1 through L4, the capacitors C5 through C8, the high frequency blocking circuits 504A through 504D, and the capacitors C10, C12, C14, and C16 to provide RF signals at the outputs O1 through O4. For example, a portion of the modified RF signal that is received at the input 520 is processed by the inductor L1, the capacitor C5, the high frequency blocking circuit 504A, and the capacitor C10 to provide an RF signal of the low frequency at the output O1. As another example, a portion of the modified RF signal that is received at the input 520 is processed by the inductor L2, the capacitor C6, the high frequency blocking circuit 504B, and the capacitor C12 to provide an RF signal of the low frequency at the output O2. As yet another example, a portion of the modified RF signal that is received at the input 520 is processed by the inductor L3, the capacitor C7, the high frequency blocking circuit 504C, and the capacitor C14 to provide an RF signal of the low frequency at the output O3. As still another example, a portion of the modified RF signal that is received at the input 520 is processed by the inductor L4, the capacitor C8, the high frequency blocking circuit 504D, and the capacitor C16 to provide an RF signal of the low frequency at the output O4.

Similarly, the modified RF signal that is received at the input 522 from the high frequency matching network 408 (FIG. 4) is processed by the capacitors C17 through C24 to provide RF signals at the outputs O1 through O4 within the combiner and distributor 121. For example, a portion of the modified RF signal of the high frequency that is received at the input 522 is processed by the capacitors C17 and C18 to provide an RF signal of the high frequency at the output O1. As another example, a portion of the modified RF signal of the high frequency that is received at the input 522 is processed by the capacitors C19 and C20 to provide an RF signal of the high frequency at the output O2. As yet another example, a portion of the modified RF signal of the high frequency that is received at the input 522 is processed by the capacitors C21 and C22 to provide an RF signal of the high frequency at the output O3. As still another example, a portion of the modified RF signal of the high frequency that is received at the input 522 is processed by the capacitors C23 and C24 to provide an RF signal of the high frequency at the output O4.

The RF signals received at the outputs O1 through O4 from the low frequency circuit 506 and the high frequency circuit 508 are combined at the outputs O1 through O4 to provide the combined RF signals at the outputs O1 through O4. For example, the RF signal received at the output O1 from the low frequency circuit 506 is summed at the output O1 with the RF signal received at the output O1 from the high frequency circuit 508 to generate the combined RF signal at the output O1. As another example, the RF signal received at the output O2 from the low frequency circuit 506 is summed at the output O2 with the RF signal received at the output O2 from the high frequency circuit 508 to generate the combined RF signal at the output O2. As yet another example, the RF signal received at the output O3 from the low frequency circuit 506 is summed at the output O3 with the RF signal received at the output O3 from the high frequency circuit 508 to generate the combined RF signal at the output O3. As another example, the RF signal received at the output O4 from the low frequency circuit 506 is summed at the output O4 with the RF signal received at the output O4 from the high frequency circuit 508 to generate the combined RF signal at the output O4.

The combined RF signal generated at the output O1 is sent from the output O1 via the switch S1 in the closed position, the balancing inductor L9, and the OUT #1 to the station 1 for plasma processing of the wafer 101 at the station 1 or is sent via the switch S1 in the open position to the dummy load DL1. Similarly, the combined RF signal generated at the output O2 is sent from the output O2 via the switch S2 in the closed position, the balancing inductor L11, and the OUT #2 to the station 2 for plasma processing of the wafer 101 at the station 2 or is sent via the switch S2 in the open position to the dummy load DL2. Moreover, the combined RF signal generated at the output O3 is sent from the output O3 via the switch S3 in the closed position, the balancing inductor L13, and the OUT #3 to the station 3 for plasma processing of the wafer 101 at the station 3 or is sent via the switch S3 in the open position to the dummy load DL3. Also, the combined RF signal generated at the output O4 is sent from the output O4 via the switch S4 in the closed position, the balancing inductor L15, and the OUT #4 to the station 4 for plasma processing of the wafer 101 at the station 4 or is sent via the switch S4 in the open position to the dummy load DL4.

The balancing inductor L9 changes a resonant frequency of circuits, e.g., the showerhead 150 of the station 1 and the pedestal of the station 1, etc., so that the circuits resonate within a pre-determined range from a pre-defined operating frequency to ignite plasma within the station 1 quickly. Similarly, the balancing inductor L11 changes a resonant frequency of circuits, e.g., the showerhead 150 of the station 2 and the pedestal of the station 2, etc., so that the circuits resonate within a pre-determined range from the pre-defined operating frequency to ignite plasma within the station 2 quickly. Also, the balancing inductor L13 changes a resonant frequency of circuits, e.g., the showerhead 150 of the station 3 and the pedestal of the station 3, etc., so that the circuits resonate within a pre-determined range from the pre-defined operating frequency to ignite plasma within the station 3 quickly. Furthermore, the balancing inductor L15 changes a resonant frequency of circuits, e.g., the showerhead 150 of the station 4 and the pedestal of the station 4, etc., so that the circuits resonate within a pre-determined range from the pre-defined operating frequency to ignite plasma within the station 4 quickly. The pre-defined operating frequency is a frequency of operation of the low frequency generator 402 when operational or a combination of the frequency of operation of the low frequency generator 402 when operational and a frequency of operation of the high frequency generator 404 when operational. Further description of a balancing inductor is provided in U.S. Pat. No. 6,199,506, which is incorporated by reference herein in its entirety.

In case one of the combined RF signals is not to be provided to one of the stations 1 through 4, a corresponding one of the outputs O1 through O4 is coupled to a corresponding one of the dummy loads DL1 through DL4. For example, when one of the combined RF signals is to not to be provided to the station 1, the processor of the probe control and system control 110 sends a signal to the switch S1 to open the switch S1 to couple the output O1 to the dummy load DL1. The dummy load DL1 has the impedance within the pre-determined limit from the impedance of the station 1 so that the other stations 2 through 4 that receive the other combined RF signals via the outputs OUT #2 through OUT #4 do not see a change in impedance at their corresponding inputs.

In some embodiments, positions, e.g., open position, closed position, etc., of the switches S1 through S4 are monitored and controlled to achieve a process parameter, examples of which are provided below. For example, a sensor, e.g., a voltage sensor, a current sensor, etc., is coupled to the normally closed terminal or to the normally open terminal of the switch to determine whether the switch is in the open or close position. The sensor is coupled to the processor of the probe control and system control 110 via a transfer cable. The sensor provides the position of the switch to the processor via the transfer cable. The processor determines whether the position corresponds to a pre-determined process parameter, e.g., pressure, temperature, etch rate, deposition rate, complex power, etc. Upon determining that the position does not correspond to the pre-determined process parameter, the processor changes the position of the switch so that the position corresponds to the pre-determined process parameter. The correspondence, e.g., one-to-one relationship, mapping, etc., between the pre-determined process parameter and a position of the switch is stored in the memory device. In this manner, positions of one or more the switches S1 through S4 are monitored and controlled to achieve the pre-determined process parameter that corresponds to the positions of the one or more of the switches S1 through S4.

In some embodiments, closing or openings of the switches S1 through S4 is synchronized, e.g., occurs at the same time, occurs within a pre-determined time range, etc., to enable or disable power to the stations 1 through 4 in a synchronous manner. For example, the processor sends a signal to one or more of the switches S1 through S4 synchronously, e.g., at the same time, within the pre-determined time range, etc., to close the switches or to open the switches synchronously.

Figure 6:
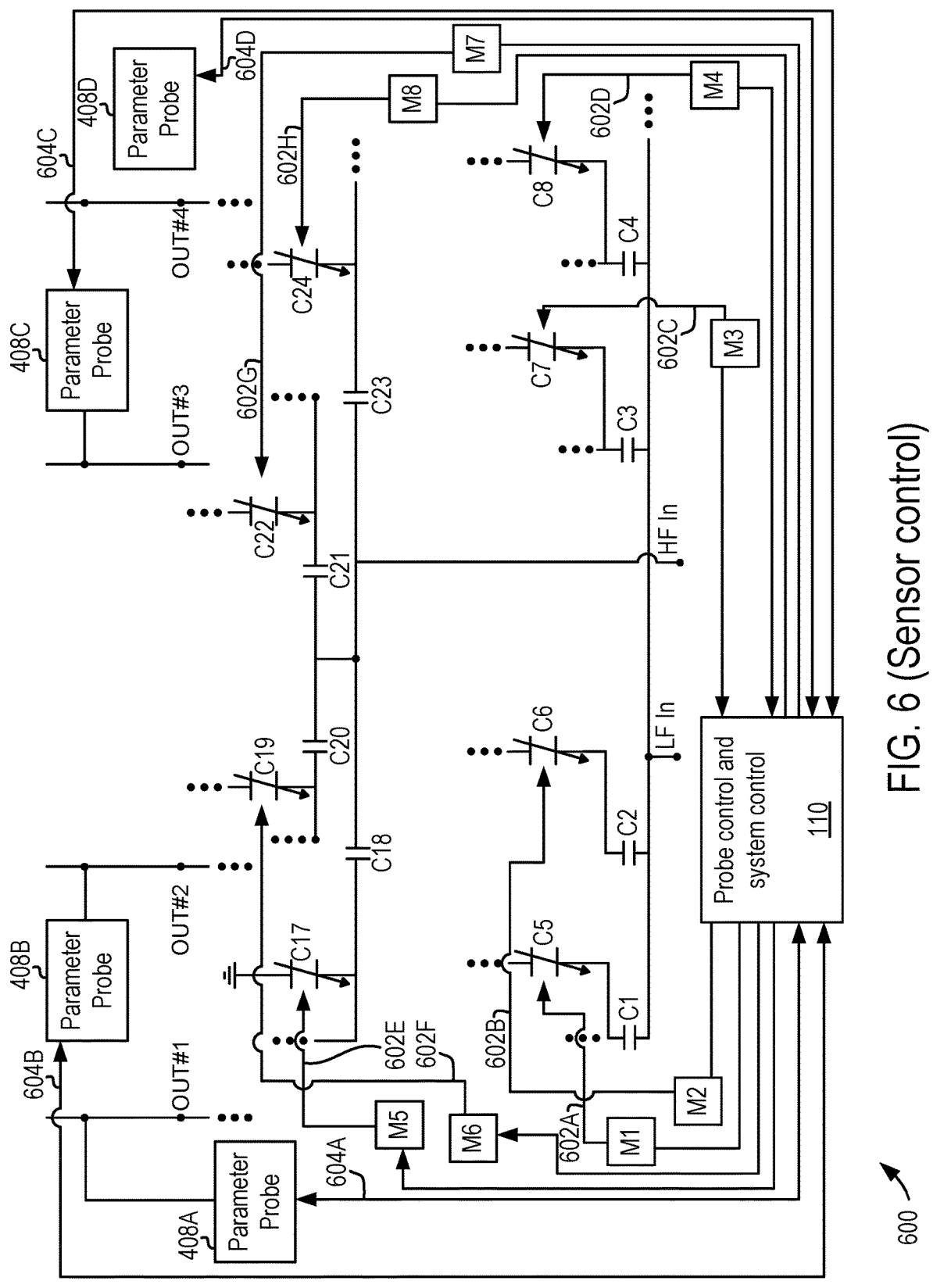

FIG. 6 is a diagram of an embodiment of a system 600 to illustrate control of the tuning elements of the combiner and distributor 121 by the probe control and system control 110. The system 600 includes the combiner and distributor 121, a portion of which is illustrated, the parameter probes 408A through 408D, and multiple motors M1, M2, M3, M4, M5, M6, M7, and M8. The motor M1 is coupled to the capacitor C5 via a connection mechanism 602A. Similarly, the motor M2 is coupled to the capacitor C6 via a connection mechanism 602B, the motor M3 is coupled to the capacitor C7 via a connection mechanism 602C, and the motor M4 is coupled to the capacitor C8 via a connection mechanism 602D. Moreover, the motor M5 is coupled to the capacitor C17 via a connection mechanism 602E, the motor M6 is coupled to the capacitor C19 via a connection mechanism 602F, the motor M7 is coupled to the capacitor C22 via a connection mechanism 602G, and the motor M8 is coupled to the capacitor C24 via a connection mechanism 602H. Examples of a connection mechanism include one or more rods, or a combination of multiple rods and one or more gears, etc.

The parameter probe 408A is coupled to the probe control and system control 110 via a transfer cable 604A, e.g., a serial transfer cable, a parallel transfer cable, a universal serial bus (USB) cable, etc. Similarly, the parameter probe 408B is coupled to the probe control and system control 110 via a transfer cable 604B, the parameter probe 408C is coupled to the probe control and system control 110 via a transfer cable 604C, and the parameter probe 408D is coupled to the probe control and system control 110 via a transfer cable 604D.

The parameter probe 408A is coupled to the OUT #1, the parameter probe 408B is coupled to the OUT #2, the parameter probe 408C is coupled to the OUT #3, and the parameter probe 408D is coupled to the OUT #4. The parameter probe 408A provides a value of the parameter measured by the parameter probe 408A at the OUT #1 via the transfer cable 604A to the probe control and system control 110. Similarly, the parameter probe 408B provides a value of the parameter measured by the parameter probe 408B at the OUT #2 via the transfer cable 604B to the probe control and system control 110. Moreover, the parameter probe 408C provides a value of the parameter measured by the parameter probe 408C at the OUT #3 via the transfer cable 604C to the probe control and system control 110. The parameter probe 408D provides a value of the parameter measured by the parameter probe 408D at the OUT #4 via the transfer cable 604D to the probe control and system control 110.

When RF power is on, e.g., is being provided to the stations 1 through 4 via the outputs OUT #1, OUT #2, OUT #3, and OUT #4, etc., process parameters, e.g., the parameter as described above, pressure within the stations 1 through 4, temperature within the stations 1 through 4, etc., are changing insitu. Moreover, when the RF power is on, plasma is generated and maintained in the stations 1 through 4 and the processor of the probe control and system control 110 receives the values of the parameter from the parameter probes 408A through 408D and determines whether one or more of capacitances of corresponding one or more of the capacitors C5, C6, C7, C8, C17, C19, C22, and C24 are to be changed so that the values of the parameter at the OUT #1, OUT #2, OUT #3, and OUT #4 are minimized, e.g., are within the pre-determined range from each other, etc. For example, the processor compares the value of the parameter received from the parameter probe 408A with the value of the parameter received from the parameter probe 408B, and determines whether the values are within the pre-determined range from each other. Upon determining that the values are not within the pre-determined range, the processor accesses the correspondence stored in the memory device of the probe control and system control 110 to identify one or more values of capacitances of the corresponding one or more capacitors C5, C6, C17, and C19. Upon identifying the one or more values, the processor generates an amount of current to drive the motor M1 so that the identified value of the capacitance of the capacitor C5 is achieved. To illustrate, an amount of drive current is sent from the processor to a stator of the motor M1. Upon receiving the drive current, the stator generates an electric field to rotate a rotor of the motor M1 to drive the motor M1. The motor M1 is driven to rotate a plate of the capacitor C5 or to change a distance between plates of the capacitor C5 to achieve the identified value of the capacitance of the capacitor C5. The change in the capacitance of the capacitor C5 changes a level, e.g., amount, peak-to-peak magnitude, root mean square (RMS) value, etc., of power of an RF signal of the low frequency that is output from the capacitor C5 to further change a level of power of the RF signal having the low frequency at the output O1 to further change a level of power of the combined RF signal provided from the OUT #1 to the station 1. In some embodiments, the change in the capacitance of the capacitor C5 changes a phase of the RF signal of the low frequency that is output from the capacitor C5 to further change a phase of the RF signal having the low frequency at the output O1 to further change a phase of the combined RF signal provided from the OUT #1 to the station 1. In various embodiments, the change in the capacitance of the capacitor C5 changes the level of power and the phase of the RF signal of the low frequency that is output from the capacitor C5 to further change the level of power and the phase of the RF signal having the low frequency at the output O1 to further change the level of power and the phase of the combined RF signal provided from the OUT #1 to the station 1.

Similarly, upon identifying the one or more values of the capacitances of the corresponding one or more capacitors C5, C6, C17, and C19, the processor generates an amount of current to drive the motor M2 so that the identified value of the capacitance of the capacitor C6 is achieved. The change in the capacitance of the capacitor C6 changes a level of power of an RF signal of the low frequency that is output from the capacitor C6 to further change a level of power of the RF signal having the low frequency at the output O2 to further change a level of power of the combined RF signal provided from the OUT #2 to the station 2. In some embodiments, the change in the capacitance of the capacitor C6 changes a phase of an RF signal of the low frequency that is output from the capacitor C6 to further change a phase of the RF signal having the low frequency at the output O2 to further change a phase of the combined RF signal provided from the OUT #2 to the station 2. In various embodiments, the change in the capacitance of the capacitor C6 changes the level of power and the phase of the RF signal of the low frequency that is output from the capacitor C6 to further change the level of power and the phase of the RF signal having the low frequency at the output O2 to further change the level of power and the phase of the combined RF signal provided from the OUT #2 to the station 2.

Moreover, similarly, upon identifying the one or more values of capacitances of the corresponding one or more capacitors C5, C6, C17, and C19, the processor generates an amount of current to drive the motor M5 so that the identified value of the capacitance of the capacitor C17 is achieved. The change in the capacitance of the capacitor C17 changes a level of power of an RF signal of the high frequency that is output from the capacitor C17 to further change a level of power of the RF signal having the high frequency at the output O1 to further change a level of power of the combined RF signal provided from the OUT #1 to the station 1. In some embodiments, the change in the capacitance of the capacitor C17 changes a phase of an RF signal of the high frequency that is output from the capacitor C17 to further change a phase of the RF signal having the high frequency at the output O1 to further change a phase of the combined RF signal provided from the OUT #1 to the station 1. In various embodiments, the change in the capacitance of the capacitor C17 changes the level of power and the phase of an RF signal of the high frequency that is output from the capacitor C17 to further change the level of power and the phase of the RF signal having the high frequency at the output O1 to further change the level of power and the phase of the combined RF signal provided from the OUT #1 to the station 1.

Furthermore, similarly, upon identifying the one or more values of capacitances of the corresponding one or more capacitors C5, C6, C17, and C19, the processor generates an amount of current to drive the motor M6 so that the identified value of the capacitance of the capacitor C19 is achieved. The change in the capacitance of the capacitor C19 changes a level of power of an RF signal of the high frequency that is output from the capacitor C19 to further change a level of power of the RF signal having the high frequency at the output O2 to further change a level of power of the combined RF signal provided from the OUT #2 to the station 2. In some embodiments, the change in the capacitance of the capacitor C19 changes a phase of the RF signal of the high frequency that is output from the capacitor C19 to further change a phase of the RF signal having the high frequency at the output O2 to further change a phase of the combined RF signal provided from the OUT #2 to the station 2. In various embodiments, the change in the capacitance of the capacitor C19 changes the level of power and the phase of an RF signal of the high frequency that is output from the capacitor C19 to further change the level of power and the phase of the RF signal having the high frequency at the output O2 to further change the level of power and the phase of the combined RF signal provided from the OUT #2 to the station 2. In this manner, one or more of the capacitances of the capacitors C5, C6, C17, and C19 are changed until the values of the parameter at the OUT #1 and OUT #2 are within the pre-determined range from each other.

In various embodiments, an association, e.g., a one-to-one-relationship, a mapping, etc., between an amount of current to drive a motor that is coupled to a capacitor of the combiner and distributor 121 and a capacitance of the capacitor achieved with the amount of current are stored within the correspondence that is stored in the memory device.

In some embodiments, the processor of the probe control and system control 110 receives the values of the parameter from the parameter probes 408A through 408D and determines whether one or more of capacitances of corresponding one of more of the capacitors C5, C6, C7, C8, C17, C19, C22, and C24 are to be changed so that the value of the parameter at the OUT #1 is within a first pre-set range, the value of the parameter at the OUT #2 is within a second pre-set range, so that the value of the parameter at the OUT #3 is within a third pre-set range, and so that the value of the parameter at the OUT #4 is within a fourth pre-set range. For example, the processor receives the value of the parameter received from the parameter probe 408A, and determines whether the value is within the first pre-set range. Upon determining that the value is not within the first pre-set range, the processor accesses the correspondence stored in the memory device of the probe control and system control 110 to identify one or more values of capacitances the corresponding one or more capacitors C5 and C17 until the value is within the first pre-set range.

In these embodiments, upon identifying the one or more values of capacitances the corresponding one or more capacitors C5 and C17, the processor generates an amount of current to drive the motor M1 so that the identified value of the capacitance of the capacitor C5 is achieved. To illustrate, an amount of drive current is sent from the processor to the stator of the motor M1. The amount of drive current changes the capacitance of the capacitor to C5 changes a level and/or phase of power of an RF signal of the low frequency that is output from the capacitor C5 to further change a level and/or phase of power of the RF signal having the low frequency at the output O1 to further change a level and/or phase of power of the combined RF signal provided from the OUT #1 to the station 1 to achieve the first pre-set range. Similarly, upon identifying the one or more values, the processor generates an amount of current to drive the motor M5 so that the identified value of the capacitance of the capacitor C17 is achieved. The change in the capacitance of the capacitor C17 changes a level and/or phase of power of an RF signal of the high frequency that is output from the capacitor C17 to further change a level and/or phase of power of the RF signal having the high frequency at the output O1 to further change a level and/or phase of power of the combined RF signal provided from the OUT #1 to the station 1. In this manner, one or more of the capacitances of the capacitors C5 and C17 are changed until the value of the parameter at the OUT #1 is within the first pre-set range from the value of the parameter at the OUT #2. Process variability is achieved by achieving the value of the parameter at the OUT #1 to be within the first pre-set range, and/or the value of the parameter at the OUT #2 to be within the second pre-set range, and/or the value of the parameter at the OUT #3 to be within the third pre-set range, and/or the value of the parameter at the OUT #4 to be within the fourth pre-set range.

In various embodiments, when the value of the parameter at the OUT #1 is within the first pre-set range and the value of the parameter at the OUT #2 is within the second pre-set range, the values of the parameter at the OUT #1 and OUT #2 are within the pre-determined range from each other. Again, process variability is achieved when the values of the parameter at the OUT #1 and OUT #2 are within the pre-determined range from each other. Similarly, in some embodiments, process variability is achieved when the values of the parameter at the OUT #1 and OUT #2 are outside the pre-determined range but the value of the parameter at the OUT #1 is within the first pre-set range and the value of the parameter at the OUT #2 is within the second pre-set range.

In various embodiments, the parameter probe 408D measures a first amount of power at the OUT #4, the parameter probe 408C measures a second amount of power at the OUT #3, the parameter probe 408B measures a third amount of power at the OUT #2, and the parameter probe 408A measures a fourth amount of power at the OUT #1. The first amount is greater than the second amount, which is greater than the third amount. The third amount is greater than the fourth amount. The measured amounts of power are provided from the parameter probes 408A through 408D to the probe control and system control 110. The probe control and system control 110 determines to achieve the amounts of the power at the OUT #1 through OUT #4 within the pre-determined range from each other. The probe control and system control 110 sends a control signal to the motor M5 to decrease a capacitance of the capacitor C17 to increase an amount of power from the capacitor C17 to the output O1 to further increase the fourth amount of power of the combined RF signal at the OUT #1 so that the fourth amount of power is within the pre-determined range from the first amount of power at the OUT #4.

In some embodiments, instead of or in addition to the parameter probes 408A through 408D, which provide in line measurements of the parameter, one or more of capacitances of corresponding one of more of the capacitors C5, C6, C7, C8, C17, C19, C22, and C24 are modified in a manner described above based on wafer measurements, e.g., measurements obtained using wafer measurement devices, etc. Examples of the wafer measurements include etch rates and deposition rates. The etch rate or deposition rate is referred to herein as a process rate. Examples of a wafer measurement device include an etch rate measurement device, a deposition rate measurement device, etc. To illustrate, the wafer measurement devices, e.g., four wafer measurement devices, etc., are coupled to the processor of the probe control and system control 110 via corresponding transfer cables and has a line of sight into the corresponding stations 1 through 4. The line of sight is directed into a space in which plasma is generated within the corresponding stations 1 through 4. For example, the wafer measurement device includes a spectrophotometer that monitors plasma within the station 1 to measure intensity of radiation emitted by the plasma. The intensity is directly proportional to an etch rate or a deposition rate of a layer of the wafer 101 that is processed by the plasma of the station 1. The processor of the probe control and system control 110 receives the measured intensity via the transfer cable to determine the process rate as directly proportional to the intensity. As another example, for a known recipe, the wafer measurement device measures a thickness of the wafer 101 at a time tm1 before or during processing, e.g., etching, depositing materials on, etc., of the wafer 101 and measures a thickness of the wafer 101 at a time tm2 after the processing of the wafer 101. The wafer measurement device determines the process rate of the wafer 101 as a ratio of a difference between the thickness at the time tm2 and the thickness at the time tm1 over a difference between the times tm2 and tm1. The process rate is provided by the wafer measurement device via the transfer cable to the processor of the probe control and system control 110. In some embodiments, instead of the wafer measurement device determining the process rate, the processor of the probe control and system control 110 determines the process rate from the measured intensity and provides the process rate to the memory device for storage. In these embodiments, the etch rate and the deposition rate are examples of an additional parameter. In these embodiments, the processor determines whether the process rate matches or is within a pre-defined range from a pre-determined process rate. Upon determining that the process rate is not within the pre-defined range, the processor determines to modify one or more of capacitances of corresponding one of more of the capacitors C5, C6, C7, C8, C17, C19, C22, and C24 so that the process rate is within the pre-defined range from the pre-determined process rate. A correspondence between the pre-determined process rate and one or more of capacitances of corresponding one of more of the capacitors C5, C6, C7, C8, C17, C19, C22, and C24 is stored in the memory device. In this manner, one or more of capacitances of corresponding one of more of the capacitors C5, C6, C7, C8, C17, C19, C22, and C24 are modified to achieve the pre-determined process rate associated with one or more of the stations 1 through 4.

In several embodiments, instead of or in addition to sensing the parameter at the outputs OUT #1, OUT #2, OUT #3, and OUT #4, position sensors are used to determine positions, e.g., distances between plates, angles between the plates, etc., of the capacitors C5, C6, C7, C8, C17, C19, C22, and C24 to control the positions so that the values of the parameter at the OUT #1, OUT #2, OUT #3, and OUT #4 are minimized Examples of the position sensors include linear sensors and rotational sensors. To illustrate, the position sensors include potentiometers or inductive position sensors or rotary encoders. Each position sensor is place in proximity to corresponding ones of the capacitors C5, C6, C7, C8, C17, C19, C22, and C24 to measure a position of the capacitor. The position is provided from the position sensor via a transfer cable to the processor of the probe control and system control 110. The probe control and system control 110 determines whether the position corresponds to the pre-determined process parameter. Upon determining that the position does not correspond to the pre-determined process parameter, the processor changes a position of the capacitor in a manner described above so that the position corresponds to, e.g., has a one-to-one relationship with, maps with, etc., the pre-determined process parameter. The correspondence between the position of the capacitor and the pre-determined process parameter is stored in the memory device. In this manner, positions of one or more of the capacitors C5, C6, C7, C8, C17, C19, C22, and C24 are monitored and controlled to achieve the pre-determined process parameter that corresponds to the positions of the one or more of the capacitors C5, C6, C7, C8, C17, C19, C22, and C24.

Figure 7:
FIG. 7 is a diagram of an embodiment to illustrate a table listing, which is an example of a correspondence between values of a parameter at outputs of the combiner and distributor, and values of a variable of the tuning elements of the combiner and distributor so that the values of the parameter at the outputs are within a pre-determined range from each other.

FIG. 7 is a diagram of an embodiment to illustrate a table listing 700, which is an example of the correspondence between values of the parameter at the outputs OUT #1, OUT #2, OUT #3, and OUT #4, and values of the variable of the tuning elements of the combiner and distributor 121 so that the values of the parameter at the outputs OUT #1, OUT #2, OUT #3, and OUT #4 are within the pre-determined range from each other. The table listing 700 is stored in the memory device of the combiner and distributor 121. The table listing 700 includes rows of values of the parameter at the outputs OUT #1 through OUT #4, and values of the variables of the capacitors C5, C6, C7, C8, C17, C19, C22, and C24 of the combiner and distributor 121.

A first row of the table listing 700 is a correspondence among a value VL1 of the parameter at the OUT #1, a value VL2 of the parameter at the OUT #2, a value VL3 of the parameter at the OUT #3, a value VL4 of the parameter at the OUT #4, a value V1 of the capacitance of the capacitor C5, a value V2 of the capacitance of the capacitor C6, a value V3 of the capacitance of the capacitor C7, a value V4 of the capacitance of the capacitor C8, a value V5 of the capacitance of the capacitor C17, a value V6 of the capacitance of the capacitor C19, a value V7 of the capacitance of the capacitor C22, and a value V8 of the capacitance of the capacitor C24. For example, when the value of the parameter at the OUT #1 is measured to be VL1 and the value of the parameter at the OUT #2 is other than VL2, to achieve the value VL2 at the OUT #2, the value of the capacitance of the capacitor C5 is changed to be V1, and/or the value of the capacitance of the capacitor C6 is changed to be V2, and/or the value of the capacitance of the capacitor C17 is changed to be V5, and/or the value of the capacitance of the capacitor C19 is changed to be V6. The values VL1 and VL2 are within the pre-determined range from each other. Similarly, a second row of the table listing 700 is a correspondence among a value VL5 of the parameter at the OUT #1, a value VL6 of the parameter at the OUT #2, a value VL7 of the parameter at the OUT #3, a value VL8 of the parameter at the OUT #4, a value V9 of the capacitance of the capacitor C5, a value V10 of the capacitance of the capacitor C6, a value V11 of the capacitance of the capacitor C7, a value V12 of the capacitance of the capacitor C8, a value V13 of the capacitance of the capacitor C17, a value V14 of the capacitance of the capacitor C19, a value V15 of the capacitance of the capacitor C22, and a value V16 of the capacitance of the capacitor C24.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining operational parameters for carrying out a particular process on or for a semiconductor wafer or to a system. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, a capacitively coupled plasma reactor, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A combiner and distributor comprising:
a first plurality of branch circuits configured to receive a modified radio frequency (RF) signal of a first frequency, wherein each of the first plurality of branch circuits includes a tuning element configured to tune a corresponding portion of the modified RF signal of the first frequency to output a plurality of RF signals of the first frequency;

a second plurality of branch circuits configured to receive a modified RF signal of a second frequency, wherein each of the second plurality of branch circuits includes a tuning element configured to tune a corresponding portion of the modified RF signal of the second frequency to output a plurality of RF signals of the second frequency; and a plurality of output branch circuits configured to combine each of the plurality of RF signals of the first frequency with a corresponding one of the plurality of RF signals of the second frequency to distribute a plurality of output signals to a plurality of plasma processing stations.

2. The combiner and distributor of claim 1, wherein the tuning element of one of the first plurality of branch circuits is configured to tune the corresponding portion of the modified RF signal of the first frequency to balance a plasma impedance associated with a corresponding one of the plurality of plasma processing stations with another plasma impedance associated with another one of the plurality of plasma processing stations.

3. The combiner and distributor of claim 2, wherein the tuning element of one of the second plurality of branch circuits is configured to tune the corresponding portion of the modified RF signal of the second frequency to balance the plasma impedance associated with the corresponding one of the plurality of plasma processing stations with the other plasma impedance associated with the other one of the plurality of plasma processing stations.

4. The combiner and distributor of claim 3, wherein the plasma impedance associated with the corresponding one the plurality of plasma processing stations is balanced with the other plasma impedance associated with the other one of the plurality of plasma processing stations when the plasma impedance associated with the corresponding one the plurality of plasma processing stations is within a pre-determined range from the other plasma impedance associated with the other one of the plurality of plasma processing stations.

5. The combiner and distributor of claim 1, wherein the tuning element of one of the first plurality of branch circuits is a variable capacitor and the tuning element of one of the second plurality of branch circuits is a variable capacitor.

6. The combiner and distributor of claim 1, wherein the first frequency is lower than the second frequency.

7. The combiner and distributor of claim 1, wherein the first plurality of branch circuits are configured to be coupled to a first impedance matching network to receive the modified RF signal of the first frequency from the first impedance matching network, and the second plurality of branch circuits are configured to be coupled to a second impedance matching network to receive the modified RF signal of the second frequency from the second impedance matching network.

8. The combiner and distributor of claim 1, wherein the first plurality of branch circuits includes a plurality of inductors and a plurality of blocking circuits, wherein the plurality of blocking circuits are configured to block RF signals of the second frequency.

9. The combiner and distributor of claim 8, wherein each of the plurality of blocking circuits includes a parallel arrangement of an inductor and a capacitor.

10. The combiner and distributor of claim 1, wherein the tuning element of one of the first plurality of branch circuits is coupled in parallel to a corresponding one of a plurality of inductors.

11. The combiner and distributor of claim 1, wherein the tuning element of one of the second plurality of branch circuits is coupled to a corresponding one of a plurality of capacitors.

12. The combiner and distributor of claim 1, wherein to tune the corresponding portion of the modified RF signal of the first frequency, the tuning element of one of the first plurality of branch circuits is configured to change an amplitude or a phase or a combination thereof of an RF signal output by the tuning element of the one of the first plurality of branch circuits.

13. The combiner and distributor of claim 1, wherein to tune the corresponding portion of the modified RF signal of the second frequency, the tuning element of a corresponding one of the second plurality of branch circuits is configured to change an amplitude or a phase or a combination thereof of an RF signal output by the tuning element of the one of the second plurality of branch circuits.

14. A plasma system comprising:
a first radio frequency (RF) generator configured to generate a first RF signal of a first frequency;
a second RF generator configured to generate a second RF signal of a second frequency;
a first impedance matching network coupled to the first RF generator to receive the first RF signal to provide a first modified RF signal of the first frequency;
a second impedance matching network coupled to the second RF generator to receive the second RF signal to provide a second modified RF signal of the second frequency;
a combiner and distributor coupled to the first and second impedance matching networks; and
a plurality of plasma processing stations coupled to the combiner and distributor,
wherein the combiner and distributor includes:
a first plurality of branch circuits configured to receive the first modified RF signal,
wherein each of the first plurality of branch circuits includes a tuning element configured to tune a corresponding portion of the first modified RF signal to output a plurality of RF signals of the first frequency;
a second plurality of branch circuits configured to receive the second modified RF signal of the second frequency,
wherein each of the second plurality of branch circuits includes a tuning element configured to tune a corresponding portion of the second modified RF signal to output a plurality of RF signals of the second frequency; and
a plurality of output branch circuits configured to combine each of the plurality of RF signals of the first frequency with a corresponding one of the plurality of RF signals of the second frequency to distribute a plurality of output signals to the plurality of plasma processing stations.

15. The plasma system of claim 14, wherein the tuning element of one of the first plurality of branch circuits is configured to tune the corresponding portion of the first modified RF signal of the first frequency to balance a plasma impedance associated with a corresponding one of a plurality of plasma processing stations with another plasma impedance associated with another one of the plurality of plasma processing stations.

16. The plasma system of claim 15, wherein the tuning element of one of the second plurality of branch circuits is configured to tune the corresponding portion of the second modified RF signal of the second frequency to balance the plasma impedance associated with the corresponding one of the plurality of plasma processing stations with the other plasma impedance associated with the other one of the plurality of plasma processing stations.

17. The plasma system of claim 16, wherein the plasma impedance associated with the corresponding one the plurality of plasma processing stations is balanced with the other plasma impedance associated with the other one of the plurality of plasma processing stations when the plasma impedance associated with the corresponding one the plurality of plasma processing stations is within a pre-determined range from the other plasma impedance associated with the other one of the plurality of plasma processing stations.

18. The plasma system of claim 14, wherein the tuning element of one of the first plurality of branch circuits is a variable capacitor and the tuning element of one of the second plurality of branch circuits is a variable capacitor.

19. A method comprising:
 receiving, by a combiner and distributor, a modified radio frequency (RF) signal of a first frequency;
 tuning, by the combiner and distributor, portions of the modified RF signal of the first frequency to output a plurality of RF signals of the first frequency;
 receiving, by the combiner and distributor, a modified RF signal of a second frequency;
 tuning, by the combiner and distributor, portions of the modified RF signal of the second frequency to output a plurality of RF signals of the second frequency; and
 combining, by the combiner and distributor, each of the plurality of RF signals of the first frequency with a corresponding one of the plurality of RF signals of the second frequency to distribute a plurality of output signals to a plurality of plasma processing stations.

20. The method of claim 19, wherein said tuning the portions of the modified RF signal of the first frequency comprises balancing a plurality of plasma impedances associated with the plurality of plasma processing stations.

21. The plasma system of claim 20, wherein said tuning the portions of the modified RF signal of the second frequency comprises said balancing the plurality of plasma impedances associated with the plurality of plasma processing stations.

22. The plasma system of claim 21, wherein said balancing is achieved when the plurality of plasma impedances are within a pre-determined range from each other.

\* \* \* \* \*